(12) United States Patent
Matsuura (10) Patent No.: US 10,830,788 B2
(45) Date of Patent: Nov. 10, 2020

(54) SENSOR DEVICE, ELECTRONIC EQUIPMENT, AND VEHICLE

(71) Applicant: SEIKO EPSON CORPORATION, Tokyo (JP)

(72) Inventor: Yoshiyuki Matsuura, Suwa (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 16/081,361

(22) PCT Filed: Feb. 16, 2017

(86) PCT No.: PCT/JP2017/005734
§ 371 (c)(1),
(2) Date: Aug. 30, 2018

(87) PCT Pub. No.: WO2017/150201
PCT Pub. Date: Sep. 8, 2017

(65) Prior Publication Data
US 2019/0025338 A1    Jan. 24, 2019

(30) Foreign Application Priority Data

Mar. 3, 2016 (JP) .................................. 2016-040772

(51) Int. Cl.
| | | |
|---|---|---|
| *G01P 15/125* | (2006.01) | |
| *H01L 29/84* | (2006.01) | |
| *G01P 15/08* | (2006.01) | |

(52) U.S. Cl.
CPC ........ *G01P 15/125* (2013.01); *G01P 15/0802* (2013.01); *H01L 29/84* (2013.01); *G01P 2015/0831* (2013.01)

(58) Field of Classification Search
CPC .............. G01P 15/125; G01P 15/0802; G01P 2015/0831; H01L 29/84
See application file for complete search history.

(56) References Cited

U.S. PATENT DOCUMENTS

| 6,935,175 B2 | 8/2005 | Eskridge et al. |
|---|---|---|
| 9,073,744 B2 | 7/2015 | Tanaka |
| (Continued) | | |

FOREIGN PATENT DOCUMENTS

| CN | 104166013 A | 11/2014 |
|---|---|---|
| CN | 104864862 A | 8/2015 |
| (Continued) | | |

*Primary Examiner* — Xin Y Zhong
(74) *Attorney, Agent, or Firm* — Harness, Dickey & Pierce, P.L.C.

(57) ABSTRACT

An acceleration sensor (sensor device) includes a substrate that includes a recessed portion (second recessed portion), a fixed electrode, and a dummy electrode juxtaposed with an insulating portion, and a movable body that is supported to be rockable by the substrate, in which the movable body includes a first region facing the fixed electrode, a second region facing a part of the dummy electrode, and a connecting portion connecting the first region and the second region to each other, the fixed electrode is provided with an extension electrode portion extending to a position facing the connecting portion, in a plan view of the movable body, at least a part of the extension electrode portion faces the connecting portion, and the insulating portion between the extension electrode portion and the dummy electrode faces the connecting portion inside the recessed portion.

8 Claims, 8 Drawing Sheets

(56) References Cited

U.S. PATENT DOCUMENTS

| | | |
|---|---|---|
| 9,151,775 B2 | 10/2015 | Yoda |
| 9,244,092 B2 | 1/2016 | Yoda |
| 9,429,589 B2 | 8/2016 | Tanaka |
| 9,470,703 B2 | 10/2016 | Tanaka |
| 2013/0042684 A1* | 2/2013 | Yoda .................... G01P 15/125 73/514.01 |
| 2013/0192370 A1 | 8/2013 | Yoda |
| 2013/0228013 A1 | 9/2013 | Tanaka |
| 2013/0263662 A1 | 10/2013 | Tanaka |
| 2013/0264661 A1 | 10/2013 | Tanaka |
| 2014/0338451 A1* | 11/2014 | Takagi ................. G01P 15/125 73/514.32 |
| 2015/0241466 A1 | 8/2015 | Tanaka |
| 2015/0377919 A1 | 12/2015 | Yoda |

FOREIGN PATENT DOCUMENTS

| | | |
|---|---|---|
| JP | 2013-040856 A | 2/2013 |
| JP | 2013-156121 A | 8/2013 |
| JP | 2013-181855 A | 9/2013 |
| JP | 2013-217721 A | 10/2013 |
| JP | 2013-217772 A | 10/2013 |
| JP | 2014-134482 A | 7/2014 |
| JP | 2014-145609 A | 8/2014 |

* cited by examiner

SENSOR DEVICE, ELECTRONIC EQUIPMENT, AND VEHICLE

CROSS-REFERENCE TO RELATED APPLICATIONS

This application is a U.S. National Phase Application under 35 U.S.C. 371 of International Application No. PCT/JP2017/005734 filed on Feb. 16, 2017 and published in Japanese as WO 2017/150201 A1 on Sep. 8, 2017 and claims the benefit of priority from Japanese Patent Application No. 2016-040772 filed Mar. 3, 2016. The entire disclosures of all of the above applications are incorporated herein by reference.

BACKGROUND

Technical Field

The present invention relates to a sensor device, and an electronic equipment, and a vehicle including the sensor device.

Related Art

In the related art, as an example of a sensor device, a capacitance type sensor in which a structure that a movable electrode is supported by a fixing portion through an elastic element such as a torsion spring is formed, and which is capable of measuring various physical quantities such as an acceleration rate and an angular velocity by detecting a change of electrostatic capacitance between electrodes when the movable electrode approaches or is distant from a fixed electrode depending on an applied external force or the like is known.

As such a capacitance type sensor, an acceleration sensor including a base substrate (substrate) that is made of glass or the like and includes a first recessed portion provided therein and a sensor portion (movable body) that is disposed on an upper side of the first recessed portion and is supported by the base substrate so as to be rockable in a depth direction of the first recessed portion by a pair of the supporting portions is disclosed (for example, refer to JP-A-2013-40856).

In the acceleration sensor, the sensor portion is divided into a first part and a second part having a heavier mass than that of the first part by the pair of supporting portions as a boundary, and includes movable electrode portions in the first part and the second part. In addition, the base substrate includes the fixed electrode portion at a position facing the movable electrode portion in the first recessed portion, and includes a second recessed portion which is deeper than the first recessed portion in a part which is nearer to a distal end side of the sensor portion than to the fixed electrode portion and which faces the distal end side of the sensor portion. In the second recessed portion, a same potential electrode portion is provided at a position facing the distal end side of the sensor portion. Also, an insulating portion in which the base substrate is exposed is provided between the fixed electrode portion and the same potential electrode portion.

However, an acceleration sensor (sensor device) disclosed in JP-A-2013-40856 includes an insulating portion in which a base substrate is exposed is provided between a fixed electrode portion and a same potential electrode portion. The base substrate (substrate) made of glass or the like is easily charged, and the insulating portion of a surface of the exposed base substrate is also easily charged. Also, in a case in which the insulating portion is charged, there is a concern that electrostatic attraction is significantly generated between the sensor portion (movable body) and the insulating portion in which the base substrate is exposed, and rocking of the sensor portion (movable body) is inhibited, or the sensor portion (movable body) is stuck to the base substrate (substrate).

SUMMARY

The invention is made to solve at least a part of the problem described above, and can be implemented as embodiments or application examples as follows.

Application Example 1

A sensor device according to this application example includes a substrate that includes a first surface, and a movable body that includes a supporting portion fixed to the substrate on the first surface side, is movable with the supporting portion as a fulcrum, and is separated from and extends to face the first surface, in which the substrate includes a recessed portion that is provided on the first surface, a fixed electrode that is provided on the first surface, a dummy electrode that is juxtaposed with the fixed electrode, of which at least a part thereof is included in the recessed portion, and that is provided on the first surface, and an insulating portion that is provided between the fixed electrode and the dummy electrode, the movable body includes a first region that faces the fixed electrode, a second region that faces a part of the dummy electrode, and a connecting portion that connects the first region and the second region to each other, the fixed electrode is provided with an extension electrode portion that extends to at least a part of the recessed portion, and, in a plan view of the movable body, at least a part of the extension electrode portion faces the connecting portion, and the insulating portion between the extension electrode portion and the dummy electrode faces the connecting portion inside the recessed portion.

According to this application example, the insulating portion positioned between the extension electrode portion and the dummy electrode is provided inside the recessed portion provided on the first surface of the substrate, and is provided across the facing connecting portion inside the recessed portion in a plan view, and thus a distance (gap) between the insulating portion and the movable body (connecting portion) facing the insulation portion can be increased. Accordingly, electrostatic attraction generated between the insulating portion and the movable body (connecting portion) facing the insulation portion can be reduced, and rocking of the movable body is suppressed from being inhibited, or sucking of the movable body to the substrate can be suppressed. Therefore, rocking of the movable body becomes appropriate (accurate), and sensing accuracy can be improved.

Application Example 2

In the sensor device disclosed in the application example, it is preferable that a width of the connecting portion in a second direction orthogonal to the first direction in which the first region and the second region are arranged is narrower than widths of the first region and the second region in the second direction.

According to this application example, when a width of the connecting portion is set to be narrower than widths of the first region and the second region, a facing area in which the movable body and the insulating portion face each other can be reduced, and thus electrostatic attraction generated between the insulating portion and the movable body facing the insulating portion can be reduced.

Application Example 3

In the sensor device disclosed in the application example, it is preferable that a plurality of the connecting portions are provided.

According to this application example, the first region and the second region are stably connected to each other, and stiffness of the movable body can be increased. Accordingly, deformation of the movable body can be suppressed, and sensing can be performed more accurately.

Application Example 4

In the sensor device disclosed in the application example, it is preferable that the connecting portions are respectively provided in both end portions of the movable body in the second direction.

According to this application example, the first region and the second region can be stably connected to each other in the second direction, deformation of the movable body in the second direction can be suppressed, and sensing can be performed more accurately.

Application Example 5

In the sensor device disclosed in the application example, it is preferable that a groove portion is provided between the first region and the second region, and the connecting portion and the second region, and in a plan view, the groove portion overlaps with the insulating portion.

According to this application example, in a plan view, when the groove portion overlaps with the insulating portion, the facing area in which the insulating portion and the movable body face each other can be reduced, and thus electrostatic attraction generated between the insulating portion and the movable body facing the insulation portion can be reduced.

Application Example 6

In the sensor device disclosed in the application example, it is preferable that the groove portion is constituted by a through hole penetrating front and rear of the movable body or a bottomed groove indented from a surface of the movable body on a side facing the substrate.

According to this application example, in a case in which the through hole is provided, an area in which the insulating portion and the movable body face each other can be reduced by the through hole, and thus electrostatic attraction generated between the insulating portion and the movable body facing the insulating portion can be reduced. In addition, in a case in which a bottomed groove indented from a surface of the movable body on aside facing the substrate is provided, the distance between the insulating portion and the movable body can be increased by the bottomed groove, and thus electrostatic attraction generated between the insulating portion and the movable body facing the insulating portion can be reduced.

Application Example 7

An electronic apparatus according to this application example includes the sensor device disclosed in any one of the application examples.

In the electronic apparatus according to this application example, the sensor device disclosed in any one example of the application examples is included, and thus high reliability can be provided.

Application Example 8

A vehicle according to this application example includes the sensor device disclosed in any one of the application examples.

According to the vehicle according to this application example, the sensor device according to any one of the application examples is included, and thus it is possible to have high reliability.

DETAILED DESCRIPTION

Hereinafter, appropriate embodiments of the invention will be described in detail with reference to drawings. Also, embodiments to be described later do not inappropriately limit contents of the invention disclosed in claims. In addition, all configurations to be described later are not necessarily essential configuration elements of the invention.

First Embodiment

Figure 1A:
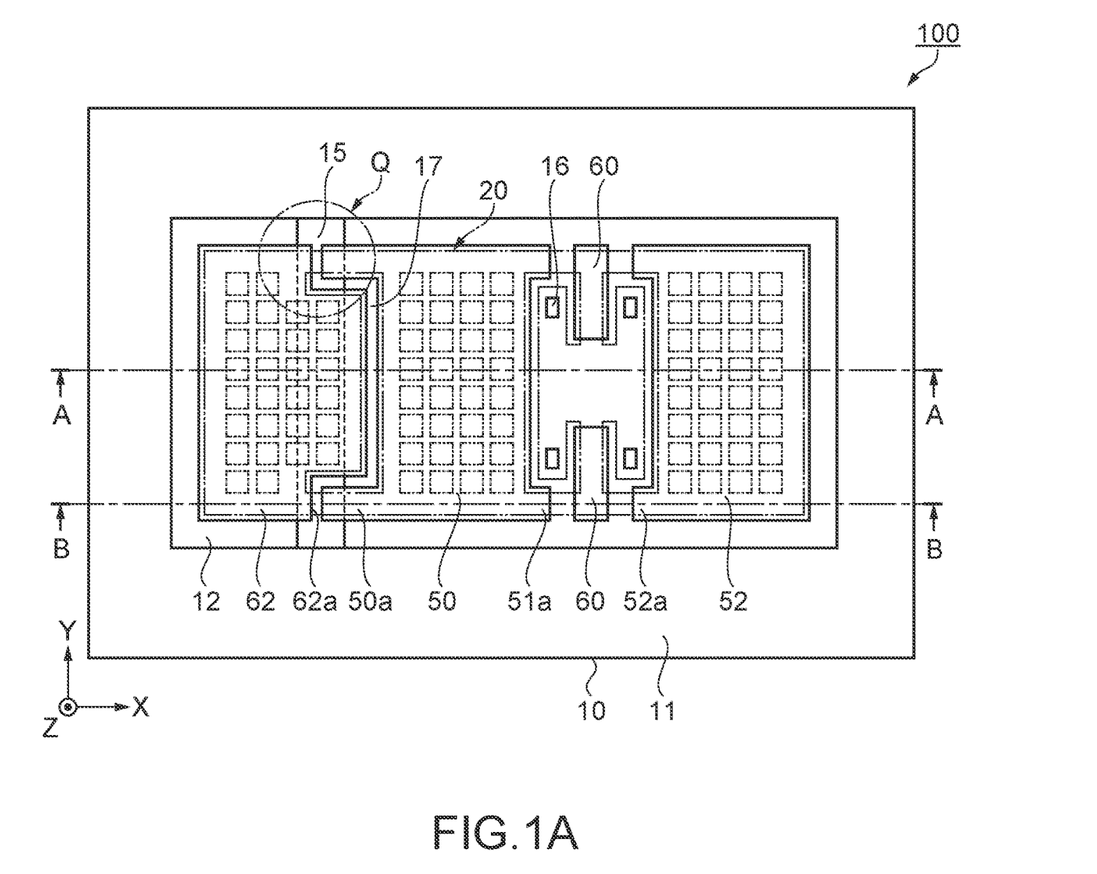
FIG. 1A is a plan view schematically illustrating an acceleration sensor according to a first embodiment of a sensor device.
Figure 1B:
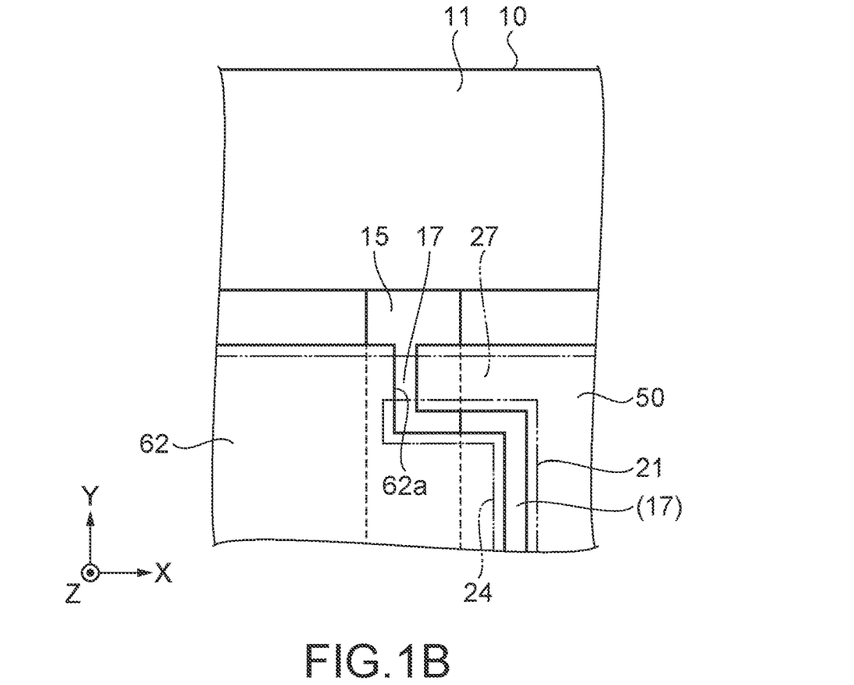
FIG. 1B is a partial enlarged view illustrating a Q part of FIG. 1A.
Figure 1C:
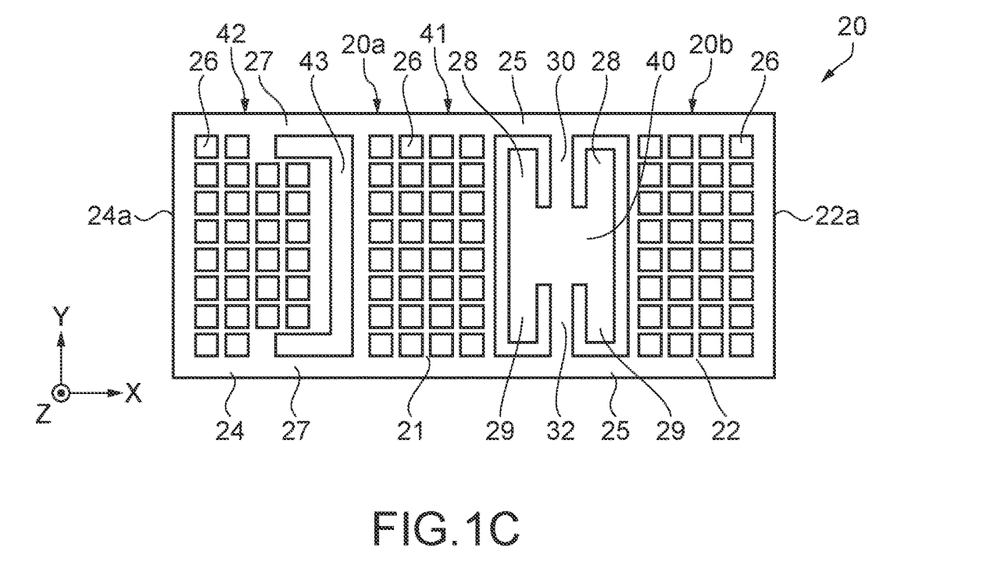
FIG. 1C is a plan view of a movable body.
Figure 2:
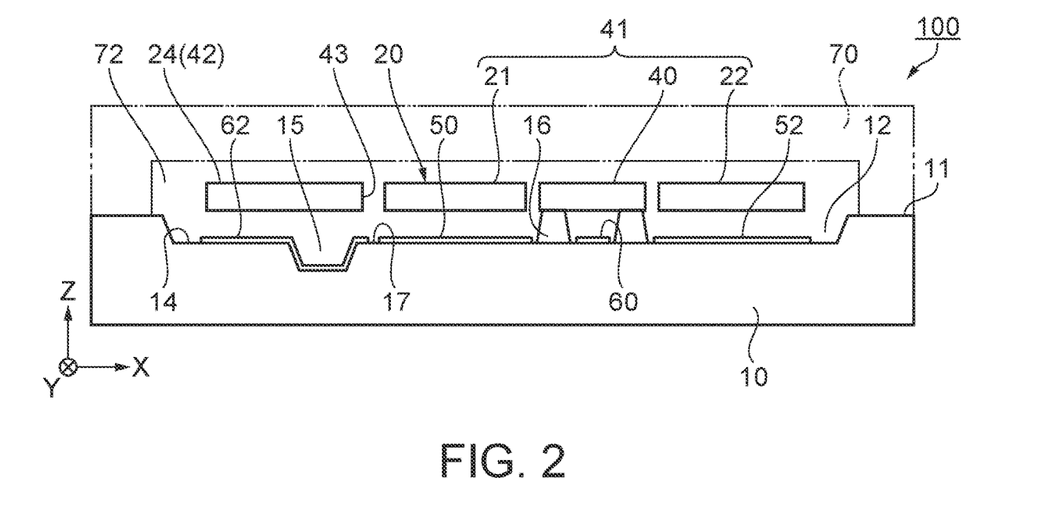
FIG. 2 is a sectional view taken along A-A line of FIG. 1A.
Figure 3:
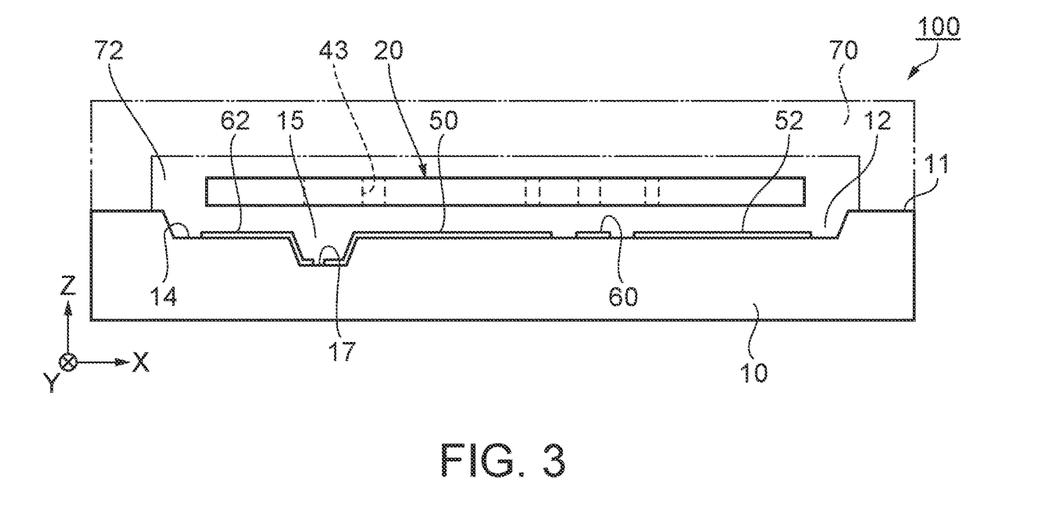
FIG. 3 is a sectional view taken along B-B line of FIG. 1A.

First, an acceleration sensor according to a first embodiment of a sensor device of the invention will be described with reference to drawings. FIG. 1A is a plan view schematically illustrating an acceleration sensor according to the first embodiment. FIG. 1B is a view illustrating a position relationship between a connecting portion and an insulating portion of a movable body, and is a partial enlarged view illustrating a Q part of FIG. 1A. FIG. 1C is a plan view of the movable body. FIG. 2 is a sectional view taken along A-A line of FIG. 1A, which schematically illustrates the acceleration sensor of the first embodiment. FIG. 3 is a sectional view taken along B-B line of FIG. 1A, which schematically illustrates the acceleration sensor of the first embodiment. Also, for the sake of convenience, in FIG. 1A, the movable body 20 is illustrated by an imaginary line (two-dot chain line), and description of a lid 70 is omitted. In addition, in each drawing, X, Y, and Z axes are illustrated as three axes orthogonal to each other as needed.

An acceleration sensor 100 of the first embodiment of the sensor device includes a substrate 10, the movable body 20, and the lid 70 as illustrated in FIGS. 1A, 1B, 1C, 2, and 3. In the embodiment, an example in which the acceleration sensor 100 is an acceleration sensor (a capacitance type MEMS acceleration sensor) that measures an acceleration rate in a vertical direction (Z axis direction) will be explained.

An insulating material such as glass can be used as a material of the substrate 10. For example, when an insulating material such as borosilicate glass is used for the substrate 10 and a semiconductor material such as silicon is used for the movable body 20, it is possible to easily and electrically insulate both the substrate and the movable body, and thus a structure of the sensor can be simplified.

The substrate 10 includes a first recessed portion 12, a second recessed portion 15 as a recessed portion, a post portion 16, a first fixed electrode portion 50 and a second fixed electrode portion 52 as a fixed electrode, and a same potential electrode (dummy electrode) 62. Also, an arrangement direction of the first fixed electrode portion 50 and the second fixed electrode portion 52 and the same potential electrode (dummy electrode) 62 is set as a first direction (X axis direction in drawing).

The first recessed portion 12 is provided on one surface 11 side of the substrate 10. The first recessed portion 12 includes a first surface 14 as a bottom surface (a surface of the substrate 10 for regulating the first recessed portion 12). The movable body 20 is disposed on an upper side of the first recessed portion 12 with a gap. In the example illustrated in FIG. 1, a planar shape (shape seen from Z axis direction) of the first recessed portion 12 is a rectangle.

The second recessed portion 15 as a recessed portion is a bottomed groove indented from the first surface 14. Therefore, regarding a depth from the one surface 11 of the substrate 10, the second recessed portion 15 is formed to be deeper than the first recessed portion 12. In a plan view, the second recessed portion 15 is provided across a connecting portion 27 connecting a first region 41 and a second region 42 of the movable body 20 to each other to be described later. Also, the second recessed portion 15 in the embodiment is provided along the entire width (a width of a second direction orthogonal to the first direction) of the first surface 14, but may be configured to be divided into a plurality of parts as long as the second recessed portion is provided across the connecting portion 27.

The post portion 16 is provided on the first surface 14. The post portion 16 protrudes upwardly (in +Z axis direction) further than the first surface 14. A height of the post portion 16 and a depth of the first recessed portion 12 are preferably the same as each other, for example. In the post portion 16, a wiring (not illustrated) for applying a predetermined potential to the movable body 20 is provided. Supporting portions 28 and 29 (FIG. 1C) of the movable body 20 are fixed to an upper surface of the post portion 16, and thus the supporting portions face the first surface 14 of the substrate 10 so as to support the movable body 20.

The first fixed electrode portion 50 and the second fixed electrode portion 52 as the fixed electrode provided on the first surface 14 and the same potential electrode (dummy electrode) 62 are disposed in parallel in the first direction (X axis direction in drawing). The first fixed electrode portion 50 and the same potential electrode (dummy electrode) 62 are in parallel through the insulating portion 17 and are electrically insulated by the insulating portion 17. In other words, the insulating portion 17 is disposed between the first fixed electrode portion 50 and the same potential electrode (dummy electrode) 62. Also, belt-shaped extension electrode portions 50a protruding to the same potential electrode (dummy electrode) 62 side are provided on both ends of the first fixed electrode portion 50 in the second direction (Y axis direction in drawing). Also, a distal end portion of the extension electrode portion 50a is positioned inside the second recessed portion 15. In addition, apart of the same potential electrode (dummy electrode) 62 is provided inside the second recessed portion 15, and a facing end portion 62a, which is provided at a position facing the distal end portion of the extension electrode portion 50a of the first fixed electrode portion 50, is also provided inside the second recessed portion 15.

The first fixed electrode portion 50 as the fixed electrode is disposed to face the first movable electrode portion 21 (refer to FIGS. 2 and 1C) to be described later. The first movable electrode portion 21 is positioned on an upper side of the first fixed electrode portion 50 with a gap. In a case in which the movable body 20 is divided into a first seesaw piece 20a and a second seesaw piece 20b (refer to FIG. 1C) to be described later by the supporting shafts 30 and 32 as a boundary, the first fixed electrode portion 50 is disposed on the substrate 10 to face the first seesaw piece 20a. Also, as described above, in the first fixed electrode portion 50, the belt-shaped extension electrode portion 50a which protrudes to the same potential electrode (dummy electrode) 62 side is provided on each of both sides in the second direction (Y axis direction in drawing). Also, the distal end portion of the extension electrode portion 50a is disposed inside the second recessed portion 15. In addition, belt-shaped extension electrode portions 51a which protrude to the second fixed electrode portion 52 side are provided on the both ends of the first fixed electrode portion 50 in the second direction (Y axis direction in drawing).

The second fixed electrode portion 52 as the fixed electrode is disposed to face a second movable electrode portion 22 (refer to FIGS. 2 and 1C) to be described later. The second movable electrode portion 22 is positioned on an upper side of the second fixed electrode portion 52 with a gap. In a case in which the movable body 20 is divided into the first seesaw piece 20a and the second seesaw piece 20b (refer to FIG. 1C) to be described later by the supporting shafts 30 and 32 as a boundary, the second fixed electrode portion 52 is disposed on the substrate 10 to face the second seesaw piece 20b. In addition, belt-shaped extension electrode portions 52a which protrude to the first fixed electrode portion 50 side are provided on the both sides of the second fixed electrode portion 52 in the second direction (Y axis direction in drawing).

An area of a part of the first fixed electrode portion 50 facing the movable body 20 and an area of a part of the second fixed electrode portion 52 facing the movable body 20 are substantially the same as each other. In addition, a planar shape of the first fixed electrode portion 50 and a planar shape of the second fixed electrode portion 52 are preferably, for example, symmetrical to each other with respect to the supporting shafts 30 and 32.

Also, it is not illustrated, but the first fixed electrode portion 50 is provided at a position facing the first movable electrode portion 21 in the lid 70, and the second fixed electrode portion 52 is provided at a position facing the second movable electrode portion 22 in the lid 70.

The same potential electrodes (dummy electrode) 60 and 62 are provided on the first surface 14 as a bottom surface of the first recessed portion 12 provided on the substrate 10. The same potential electrodes (dummy electrodes) 60 and 62 are provided in order to suppress electrostatic attraction (electrostatic force) acting between the movable body 20 and the substrate 10 and electrostatic attraction acting between the supporting shafts 30 and 32 and the substrate 10. The same potential electrode (dummy electrodes) 60 is provided at a position facing the supporting shafts 30 and 32. The same potential electrode (dummy electrode) 62 is provided at a position facing the second region 42 of the movable body 20 to be described later. The same potential electrodes (dummy electrodes) 60 and 62 in this configuration are electrodes which are electrically connected to the movable body 20, that is, are the same potential as the movable body 20.

The same potential electrodes (dummy electrodes) 60 and 62 are electrically connected to the movable body 20, for example, through a wiring (not illustrated) provided on a front surface of the post portion 16, a fixing portion 40, and the supporting portions 28 and 29. Also, the movable body 20 and the same potential electrodes (dummy electrodes) 60 and 62 may be electrically connected to each other through a bonding wire (not illustrated) or the like. In the acceleration sensor 100, since the same potential electrodes (dummy electrodes) 60 and 62 are electrically connected to the movable body 20, the same potential electrodes (dummy electrodes) 60 and 62 and the movable body 20 can be set to be the same potential. Accordingly, it is possible to suppress electrostatic attraction (electrostatic force) acting between the movable body 20 and the substrate 10.

The first fixed electrode portion 50, the second fixed electrode portion 52, and the same potential electrodes (dummy electrodes) 60 and 62 can be made of, for example, aluminum, gold, platinum, or indium tin oxide (ITO). As long as a material of the first fixed electrode portion 50, the second fixed electrode portion 52, and the same potential electrodes (dummy electrodes) 60 and 62 is a transparent electrode material such as ITO, in a case in which the substrate 10 is a transparent substrate (glass substrate), it is possible to easily visually recognize foreign materials or the like present on the first fixed electrode portion 50, the second fixed electrode portion 52, and the same potential electrodes (dummy electrodes) 60 and 62. In addition, in a case in which a material such as platinum which is electrically stable is selected, it is possible to reduce noise of the acceleration sensor.

The insulating portion 17 is configured to include the substrate 10 exposed therein without providing various electrodes. At least a part of the insulating portion 17 is disposed inside the second recessed portion 15. Specifically, inside the second recessed portion 15, the insulating portion 17 is also disposed between the belt-shaped extension electrode portion 50a which is apart of the first fixed electrode portion 50 and the facing end portion 62a of the same potential electrode (dummy electrodes) 62 facing the extension electrode portion 50a. The insulating portion 17 disposed described above is provided across the connecting portion 27 (refer to FIG. 1B) of the movable body 20 facing the extension electrode portion 50a of the first fixed electrode portion 50 to be described later inside the second recessed portion 15 in a plan view.

As described above, since the insulating portion 17 is provided across the connecting portion 27 of the movable body 20 facing the extension electrode portion 50a of the first fixed electrode portion 50 to be described later inside the second recessed portion 15, a distance (gap) between the insulating portion 17 and the connecting portion 27 (movable body 20) facing the insulating portion can be increased. Accordingly, electrostatic attraction generated between the insulating portion 17 and the connecting portion 27 facing the insulating portion can be reduced, and thus rocking of the movable body 20 can be suppressed from being inhibited, or sucking of the movable body 20 to the substrate 10 can be suppressed.

As illustrated in FIG. 1C, the movable body 20 includes the fixing portion 40, the supporting portions 28 and 29 extending from the fixing portion 40, the supporting shafts 30 and 32 including for example, an elastic element such as a torsion spring, the first seesaw piece 20a, the second seesaw piece 20b, a connection frame portion 25 which connects the first seesaw piece 20a and the second seesaw piece 20b to each other, the first movable electrode portion 21, and the second movable electrode portion 22. In the movable body 20, the supporting portions 28 and 29 are fixed to an upper surface of the post portion 16 provided on the substrate 10, and the supporting portions 28 and 29 and the connection frame portion 25 are connected by the supporting shafts 30 and 32 extending from the supporting portions 28 and 29. As described above, the movable body 20 faces the substrate 10, and is supported to be rockable through the supporting shafts 30 and 32.

The movable body 20 can be displaced around the supporting shafts 30 and 32. Specifically, the movable body 20 seesaw-shakes around the supporting shafts 30 and 32 as a rotation shaft (rocking shaft) when the acceleration rate of the vertical direction (Z axis direction) is applied thereto. The supporting shafts 30 and 32 are in parallel to, for example, a Y axis. A planar shape of the movable body 20 is, for example, a rectangle. A thickness of the movable body 20 (size in Z axis direction) is, for example, constant.

The movable body 20 includes the first seesaw piece 20a and the second seesaw piece 20b. The first seesaw piece 20a is, in a plan view, one part (a part positioned on a left side in FIG. 1C) of two parts of the movable body 20 divided by the supporting shafts 30 and 32. The second seesaw piece 20b is, in a plan view, another part (a part positioned on a right side in FIG. 1C) of the two parts of the movable body 20 divided by the supporting shafts 30 and 32. That is, the movable body 20 is divided into the first seesaw piece 20a and the second seesaw piece 20b by the supporting shafts 30 and 32 as a boundary.

For example, in a case in which the acceleration rate (for example, gravitational acceleration) of the vertical direction (Z axis direction) is applied to the movable body 20, rotation moment (moment of force) is generated in each of the first seesaw piece 20a and the second seesaw piece 20b. Here, in a case in which the rotation moment (for example, rotation moment in a counterclockwise direction) of the first seesaw piece 20a and the rotation moment (for example, rotation moment in a clockwise direction) of the second seesaw piece 20b are in balance, the acceleration rate cannot be measured without changing inclination of the movable body 20. Therefore, when the acceleration rate of the vertical direction is applied, the movable body 20 is designed so that the movable body 20 is inclined by a predetermined angle without balancing of the rotation moment of the first seesaw piece 20a and the rotation moment of the second seesaw piece 20b.

In the acceleration sensor 100, the supporting shafts 30 and 32 are disposed at a position deviated from the center of the movable body 20 (center of gravity), in other words, distances from the supporting shafts 30 and 32 to distal ends of the first seesaw piece 20a and the second seesaw piece 20b are set to be different from each other, and thus the first seesaw piece 20a and the second seesaw piece 20b have a different mass from each other. That is, in the movable body 20, one side (first seesaw piece 20a) and another side (second seesaw piece 20b) have a different mass from each other by the supporting shafts 30 and 32 as a boundary. In the example as illustrated in the drawing, distances from the supporting shafts 30 and 32 to an end surface 24a of the first seesaw piece 20a are longer than distances from the supporting shafts 30 and 32 to an end surface 22a of the second seesaw piece 20b. In addition, a thickness of the first seesaw piece 20a and a thickness of the second seesaw piece 20b are the same as each other. Therefore, the mass of the first seesaw piece 20a is greater that of than the second seesaw piece 20b. As described above, the first seesaw piece 20a and the second seesaw piece 20b have a different mass from each other, and thus when the acceleration rate in the vertical direction is applied, it is possible to not balance the rotation moment of the first seesaw piece 20a and the rotation moment of the second seesaw piece 20b. Therefore, when the acceleration rate of the vertical direction is applied, the movable body 20 can be inclined by a predetermined angle.

Also, it is not illustrated, but the supporting shafts 30 and 32 are disposed on the center of the movable body 20, and the thicknesses of the first seesaw piece 20a and the second seesaw piece 20b are set to be different from each other, and thus the first seesaw piece 20a and the second seesaw piece 20b may have a different mass from each other. Even in this case, when the acceleration rate of the vertical direction is applied, the movable body 20 can be inclined by a predetermined angle.

The movable body 20 can be divided into the first region 41 at least facing the fixed electrode (first fixed electrode portion 50 and second fixed electrode portion 52) provided on the substrate 10 and the second region 42 at least facing a part of the same potential electrode (dummy electrode) 62.

The first region 41 includes at least the first movable electrode portion 21 and the second movable electrode portion 22 provided by the supporting shafts 30 and 32 as a boundary. A groove portion (elongated through hole) 43 is provided between the second region 42 and the first region 41. The second region 42 includes an extension portion 24 connected to the first region 41 by the belt-shaped connecting portions 27, which include the groove portion (elongated through hole) 43 therebetween and are provided on each end (both ends) in the second direction (Y axis direction in drawing). Also, a width dimension of the belt-shaped connecting portion 27 which is a length of the belt-shaped connecting portion in the second direction is narrower than a width dimension of the first region 41 and a width dimension of the second region 42. In addition, the belt-shaped connecting portions 27 are described as an example in which belt-shaped connecting portions are respectively provided on both ends (two positions) of the second region 42, but the belt-shaped connecting portions may be provided at three or more positions.

As described above, in the movable body 20, when the second region 42 (extension portion 24) is provided, a mass of the first seesaw piece 20a side can be set to be heavier than a mass of the second seesaw piece 20b side by the supporting shafts 30 and 32 as a boundary.

In addition, when the first region 41 (including first movable electrode portion 21 and second movable electrode portion 22) and the second region 42 (extension portion 24) are connected by a plurality of the belt-shaped connecting portions 27 provided on each end (both ends) in the second direction (Y axis direction in drawing), the first region 41 and the second region 42 can be stably connected to each other in the second direction, and thus deformation of the movable body 20 in the second direction can be suppressed, and sensing can be performed more accurately.

In addition, when the width dimension of the connecting portion 27 is set to be narrower than the width dimensions of the first region 41 and the second region 42, a facing area in which the movable body 20 and the insulating portion 17 (refer to FIGS. 1A and 1B) of the substrate 10 face each other can be reduced, and thus electrostatic attraction generated between the insulating portion 17 and the movable body 20 facing thereto can be reduced.

The groove portion 43, which is provided between the first region 41 and the second region 42, is preferably disposed to be overlapped with the insulating portion 17 (refer to FIG. 1A) provided on the substrate 10 in a plan view. As described above, in a plan view, when the groove portion 43 is overlapped with the insulating portion 17, the facing area in which the insulating portion 17 and the movable body 20, in which electrostatic attraction is easily generated, face each other can be reduced, and thus the electrostatic attraction generated between the insulating portion 17 and the movable body 20 facing the insulating portion can be reduced.

The movable body 20 is provided to be separated from the substrate 10 except the post portion 16. The movable body 20 is provided on an upper side of the first recessed portion 12. In the illustrated example, a gap is provided between the movable body 20 and the substrate 10. In addition, the movable body 20 is separately connected to the fixing portion 40 by the supporting portions 28 and 29 supported by the post portion 16 and the supporting shafts 30 and 32 extending from the supporting portions 28 and 29. Accordingly, the movable body 20 can be seesaw-rocked.

The movable body 20 includes the first movable electrode portion 21 and the second movable electrode portion 22 which are provided by the supporting shafts 30 and 32 as a boundary. The first movable electrode portion 21 is provided in the first seesaw piece 20a. The second movable electrode portion 22 is provided in the second seesaw piece 20b.

The first movable electrode portion 21 is an overlapped part in the movable body 20 with the first fixed electrode portion 50 as the fixed electrode portion in a plan view. The first movable electrode portion 21 forms electrostatic capacitance C1 between the first fixed electrode portion 50 and the first movable electrode portion. That is, the electrostatic capacitance C1 is formed by the first movable electrode portion 21 and the first fixed electrode portion 50.

The second movable electrode portion 22 is an overlapped part in the movable body 20 with the second fixed electrode portion 52 as the fixed electrode portion in a plan view. The second movable electrode portion 22 forms electrostatic capacitance C2 between the second fixed electrode portion 52 and the second movable electrode portion. That is, the electrostatic capacitance C2 is formed by the second movable electrode portion 22 and the second fixed electrode portion 52. In the acceleration sensor 100, when the movable body 20 is made of a conductive material (impurity doped silicon), the first movable electrode portion 21 and the second movable electrode portion 22 are provided. That is, the first seesaw piece 20a functions as the first movable electrode portion 21, and the second seesaw piece 20b functions as the second movable electrode portion 22.

The electrostatic capacitance C1 and electrostatic capacitance C2 are configured to be the same as each other, for example, in a state in which the movable body 20 illustrated in FIG. 2 is horizontal. Positions of the first movable electrode portion 21 and the second movable electrode portion 22 are changed in accordance with movement of the movable body 20. In accordance with the positions of the first movable electrode portion 21 and the second movable electrode portion 22, the electrostatic capacitance C1 and C2 are changed. A predetermined potential is applied to the movable body 20 through the supporting portions 28 and 29.

In the movable body 20, a through hole 26 penetrating the movable body 20 is provided. Accordingly, influence of air (resistance of air) when the movable body 20 is rocked can be reduced. In the example as illustrated, a plurality of through holes 26 are arranged. Also, shapes, sizes, disposing (arrangement) shapes, disposing numbers, and the like of the through holes 26 does not matter.

The supporting portions 28 and 29 support the movable body 20 to be displaceable around the supporting shafts 30 and 32. The supporting shafts 30 and 32 function as a torsion spring (twist spring). Accordingly, a strong restoring force with respect to torsional deformation generated in the supporting shafts 30 and 32 when the movable body 20 is seesaw-rocked can be provided.

The supporting portions 28 and 29 are disposed on the post portion 16 in a plan view. The supporting portions 28 and 29 extend from the fixing portion 40, and the post portion 16 and the movable body 20 (the connection frame portion 25) are connected to each other through the supporting shafts 30 and 32. The supporting portions 28 and 29 extend along the supporting shafts 30 and 32 one by one on the both sides of the supporting shafts 30 and 32 in the X axis direction. The supporting portion 28 extends from the fixing portion 40 in a +Y axis direction. The supporting portion 29 extends from the fixing portion 40 in a −Y axis direction.

The fixing portion 40 is provided between the first seesaw piece 20a and the second seesaw piece 20b. The supporting portions 28 and 29, and the supporting shafts 30 and 32 extend from the fixing portion 40. The movable body 20 is connected and fixed to the post portion 16 of the substrate 10 at a position of the supporting portions 28 and 29 through the supporting shafts 30 and 32 and the fixing portion 40. In the embodiment, the center of each of the supporting portion 28 and the supporting portion 29 is connected and fixed to the post portion 16.

The movable body 20 constituted by the fixing portion 40, the supporting portions 28 and 29, the supporting shafts 30 and 32, the first seesaw piece 20a, the second seesaw piece 20b, the connection frame portion 25, and the like is integrally provided. The movable body 20 is integrally provided by patterning, for example, one substrate (silicon substrate). In the example as illustrated, the movable body 20 is configured as one structure (silicon structure). A material of the movable body 20 is, for example, silicon to which conductivity is applied by doping impurities such as phosphorus and boron. In a case in which the material of the substrate 10 is glass and the material of the movable body 20 is silicon, the substrate 10 and the supporting portions 28 and 29 can be bonded to each other by, for example, anodic bonding.

The lid 70 is disposed on the substrate 10, and is bonded to the substrate 10. The lid 70 and the substrate 10 constitute a cavity 72 accommodating the movable body 20. The cavity 72 is, for example, inert gas (for example, nitrogen gas) atmosphere. A material of the lid 70 is, for example, silicon. In a case in which the material of the lid 70 is silicon and the material of the substrate 10 is glass, the substrate 10 and the fixing portion 40 can be bonded to each other by, for example, anodic bonding.

Next, an operation of the acceleration sensor 100 will be described.

In the acceleration sensor 100, in accordance with a physical quantity such as the acceleration rate and angular velocity, the movable body 20 is rocked around the supporting shafts 30 and 32. In accordance with the movement of the movable body 20, a distance between the first movable electrode portion 21 and the first fixed electrode portion 50, and a distance between the second movable electrode portion 22 and the second fixed electrode portion 52 are changed.

Specifically, for example, when the acceleration rate in a vertical and upward direction (+Z axis direction) is applied to the acceleration sensor 100, the movable body 20 is rotated in a counterclockwise direction, the distance between the first movable electrode portion 21 and the first fixed electrode portion 50 is reduced, and the distance between the second movable electrode portion 22 and the second fixed electrode portion 52 is increased. As a result, the electrostatic capacitance C1 is increased, and the electrostatic capacitance C2 is decreased.

In addition, for example, when the acceleration rate in a vertical and downward direction (−Z axis direction) applied to the acceleration sensor 100, the movable body 20 is rotated in a clockwise direction, the distance between the first movable electrode portion 21 and the first fixed electrode portion 50 is increased, and a distance between the second movable electrode portion 22 and the second fixed electrode portion 52 is reduced. As a result, the electrostatic capacitance C1 is decreased, and the electrostatic capacitance C2 is increased. Therefore, based on a difference between the electrostatic capacitance C1 and the electrostatic capacitance C2 (so called differential detecting method), a physical quantity such as a direction or a dimension of the acceleration rate, angular velocity, or the like can be measured.

As described above, the acceleration sensor 100 can be used as an acceleration sensor, an inertial sensor such as a gyro sensor, and specifically, can be used as, for example, a capacitance type acceleration sensor for measuring the acceleration rate in the vertical direction (Z axis direction).

According to the acceleration sensor 100 described above, the groove portion 43 provided between the first region 41 and the second region 42 is disposed to be overlapped with the insulating portion 17 provided on the substrate 10 in a plan view. As described above, in a plan view, when the groove portion 43 is overlapped with the insulating portion 17, a facing area in which the insulating portion 17 and the movable body 20 face each other, where electrostatic attraction is easily generated, can be reduced, and thus electrostatic attraction generated between the insulating portion 17 and the movable body 20 facing the insulating portion can be reduced.

In addition, since the insulating portion 17 is provided across the connecting portion 27 of the movable body 20 facing the extension electrode portion 50a of the first fixed electrode portion 50 to be described later inside the second recessed portion 15, in a part where the insulating portion 17 is overlapped with the connecting portion 27 (movable body 20), a distance (gap) between the insulating portion 17 and the connecting portion 27 (movable body 20) facing the insulating portion can be increased. Accordingly, electrostatic attraction generated between the insulating portion 17 and the connecting portion 27 facing the insulating portion can be reduced, rocking of the movable body 20 can be suppressed from being inhibited, or sucking of the movable body 20 to the substrate 10 can be suppressed.

In addition, when a width dimension of the connecting portion 27 is set to be narrower than width dimensions of the first region 41 and the second region 42, a facing area in which the movable body 20 and the insulating portion 17 of the substrate 10 (refer to FIG. 1A) face each other can be reduced, and thus, electrostatic attraction generated between the insulating portion 17 and the movable body 20 facing the insulating portion can be reduced.

Accordingly, rocking of the movable body 20 is inhibited, or sucking of the movable body 20 to the substrate 10 can be suppressed. Therefore, regarding the acceleration sensor 100 described above, rocking of the movable body 20 become appropriate (accurate), and it is possible to improve sensing accuracy.

Second Embodiment

Figure 4:
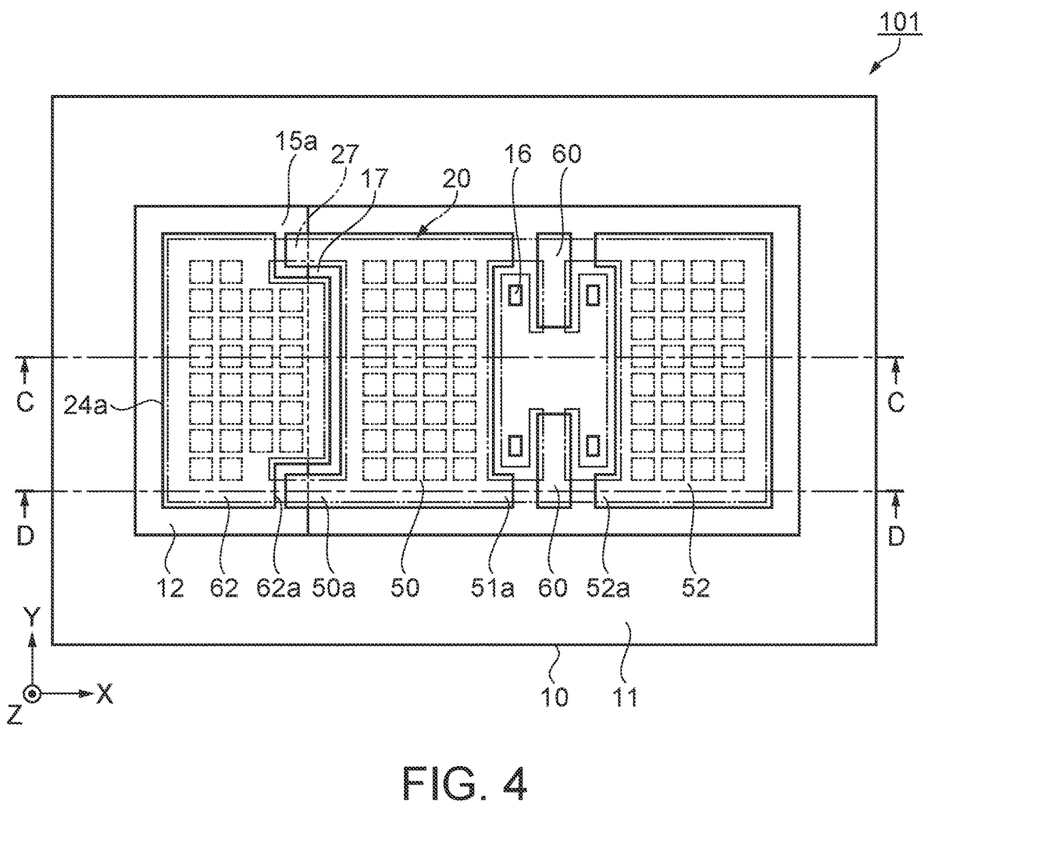
FIG. 4 is a plan view schematically illustrating an acceleration sensor according to a second embodiment of the sensor device.
Figure 5:
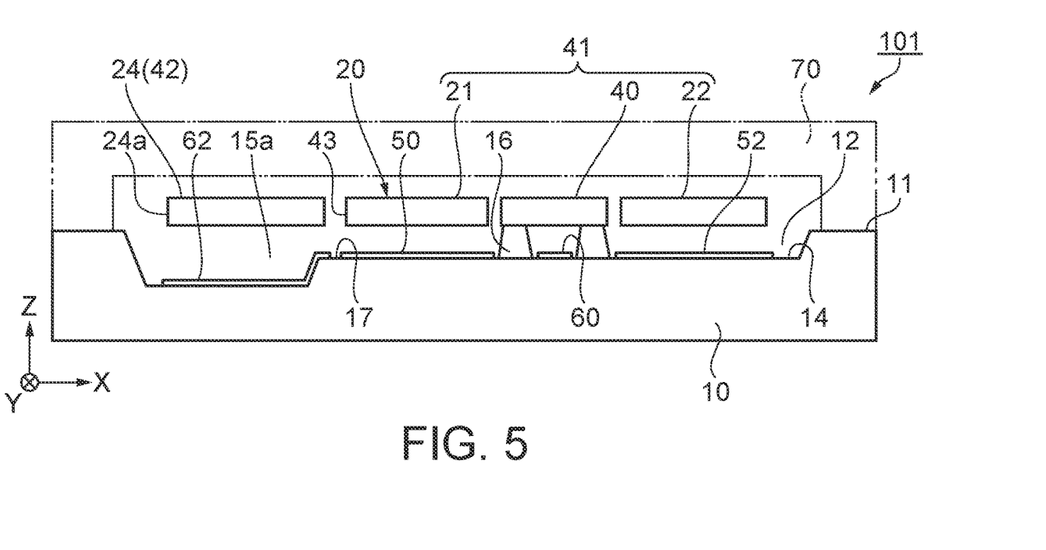
FIG. 5 is a sectional view taken along C-C line of FIG. 4.
Figure 6:
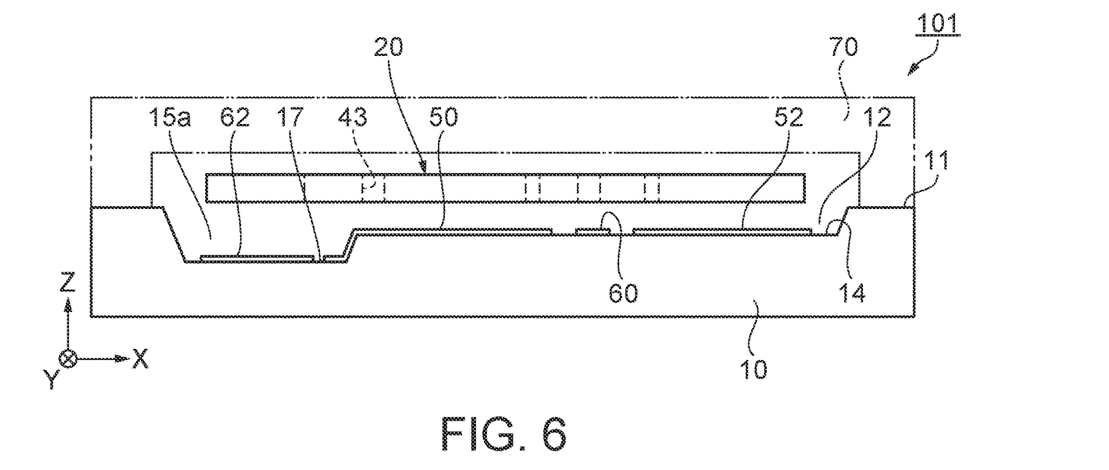
FIG. 6 is a sectional view taken along D-D line of FIG. 4.

Next, an acceleration sensor according to a second embodiment of the sensor device of the invention will be described with reference to drawings. FIG. 4 is a plan view schematically illustrating the acceleration sensor according to the second embodiment. FIG. 5 is a sectional view taken along C-C line of FIG. 4 which schematically illustrates the acceleration sensor according to the second embodiment, FIG. 6 is a sectional view taken along D-D line of FIG. 4 which schematically illustrates the acceleration sensor according to the second embodiment. Also, for the sake of convenience, in FIG. 4, the movable body 20 is illustrated by an imaginary line (two-dot chain line), and illustration of the lid 70 is omitted. In addition, in each drawing, an X axis, a Y axis, a Z axis are illustrated as three axes which are orthogonal to each other as needed.

Hereinafter, in description of an acceleration sensor 101 according to the second embodiment of the sensor device, the same numeral is given to a member having the same function as that of a configuration member of the acceleration sensor 100 of the first embodiment, and description thereof will be omitted.

The acceleration sensor 101 according to the second embodiment includes on the substrate 10 the first recessed portion 12, a second recessed portion 15a as a recessed portion, the post portion 16, the first fixed electrode portion 50 and the second fixed electrode portion 52 as a fixed electrode, and the same potential electrode (dummy electrode) 62. The acceleration sensor 101 according to the second embodiment has a different configuration in the second recessed portion 15a compared with the acceleration sensor 100 of the first embodiment described above. Therefore, in the invention, the second recessed portion 15a will be mainly described, and description of other configuration members will be omitted.

The second recessed portion 15a as a recessed portion is a bottomed groove portion indented from the first surface 14 of the first recessed portion 12. Therefore, regarding a depth of the substrate 10 from the one surface 11, the second recessed portion 15a is formed to be deeper than the first recessed portion 12. The second recessed portion 15a includes one opening end at a position across the connecting portion 27 connecting the first region 41 and the second region 42 of the movable body 20 to each other described in the first embodiment in a plan view, and includes another end at a position overlapped with the first recessed portion 12. In other words, the second recessed portion 15a is provided as a region including a part of the connecting portion 27 and the end surface 24a side of the extension portion 24 in a plan view.

Since the second recessed portion 15a is disposed as a configuration described above, the same potential electrode (dummy electrode) 62, which is provided at a position facing the second region 42 of the movable body 20, is substantially provided on a bottom surface of the second recessed portion 15a, and a part thereof is provided on the first surface 14 of the first recessed portion 12.

In addition, a part of the insulating portion 17 is disposed inside the second recessed portion 15a, and inside the second recessed portion 15a, and also disposed between the belt-shaped extension electrode portion 50a, which is a part of the first fixed electrode portion 50, and the facing end portion 62a of the same potential electrode (dummy electrode) 62 facing the extension electrode portion 50a. The insulating portion 17 disposed as described above, in a plan view, inside the second recessed portion 15a, is provided across the connecting portion 27 of the movable body 20 facing the extension electrode portion 50a of the first fixed electrode portion 50.

Even in the acceleration sensor 101 according to the second embodiment, as described above, since the insulating portion 17 is provided across the connecting portion 27 of the movable body 20 facing the extension electrode portion 50a of the first fixed electrode portion 50 inside the second recessed portion 15a, the distance (gap) between the insulating portion 17 and the connecting portion 27 (movable body 20) facing the insulating portion can be increased. Accordingly, electrostatic attraction generated between the insulating portion 17 and the connecting portion 27 facing the insulating portion can be reduced, rocking of the movable body 20 can be suppressed from being inhibited, or sucking of the movable body 20 to the substrate 10 can be suppressed.

(Modification Example of Movable Body)

Figure 7:
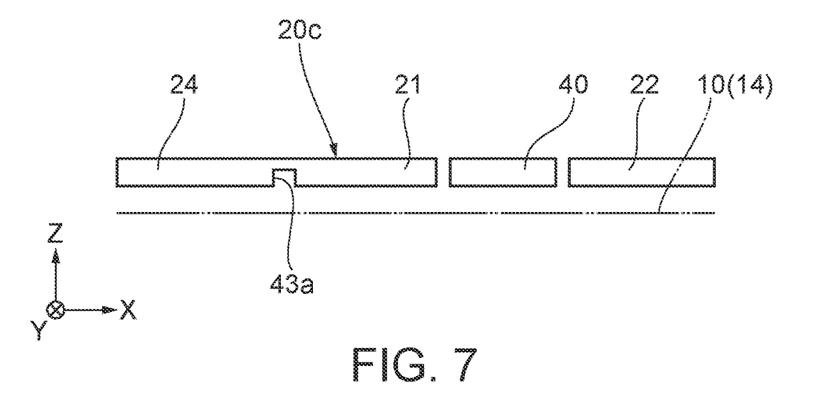
FIG. 7 is a front sectional view illustrating a modification example of the movable body.

Here, a modification example of the movable body 20 described above will be described with reference to FIG. 7. FIG. 7 is a front sectional view illustrating the modification example of the movable body 20. The modification example indicates a modification example of the groove portion (elongated through hole) 43 provided in the movable body 20 in the acceleration sensor 100 of the first embodiment. Therefore, the same numerals are given to configuration members other than member corresponding to the groove portion (elongated through hole) 43 and description thereof will be omitted.

A movable body 20c according to the modification example can be divided into the first region 41 facing at least the fixed electrode (first fixed electrode portion 50 and second fixed electrode portion 52) provided on the substrate 10 and the second region 42 facing at least a part of the same potential electrode (dummy electrode) 62 in the same manner as the movable body 20 of the first embodiment. A bottomed groove 43a is provided between the first region 41 and the second region 42. The bottomed groove 43a is a groove in a recessed shape including a bottom portion which is indented from a surface of a side of the movable body 20c facing the substrate 10 (the first surface 14).

According to the movable body 20c of the modification example, as described above, because the bottomed groove 43a indented from a surface of a side of the movable body 20c facing the substrate 10 is provided, the distance between the insulating portion 17 (refer to FIG. 1A) and the movable body 20c can be increased, and thus electrostatic attraction generated between the insulating portion 17 and the movable body 20c facing the insulation portion can be reduced.

Electronic Apparatus

Next, an electronic apparatus according to the invention will be described with reference to drawings. The electronic apparatus according to the invention includes the acceleration sensor 100 as the sensor device described above. Hereinafter, the electronic apparatus using the acceleration sensor 100 as the sensor device according to the invention will be exemplified to be described.

Figure 8:
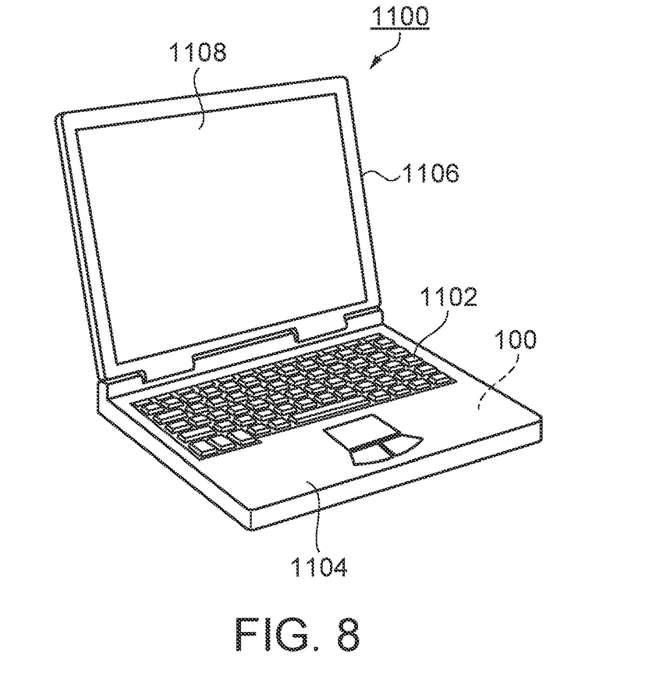
FIG. 8 is a perspective view schematically illustrating a configuration of a mobile type (or note type) personal computer as an electronic apparatus including a sensor device.

First, a mobile type (or note type) personal computer is illustrated as an example of the electronic apparatus according to the invention and will be described with reference to FIG. 8. FIG. 8 is a perspective view schematically illustrating the mobile type (or note type) personal computer as an example of the electronic apparatus.

As illustrated in FIG. 8, a personal computer 1100 is constituted by a main body portion 1104 provided with a keyboard 1102, and a display unit 1106 including a display portion 1108, and the display unit 1106 is rotatably supported with respect to the main body portion 1104 through a hinge structure portion. In such a personal computer 1100, the acceleration sensor 100 is embedded.

Figure 9:
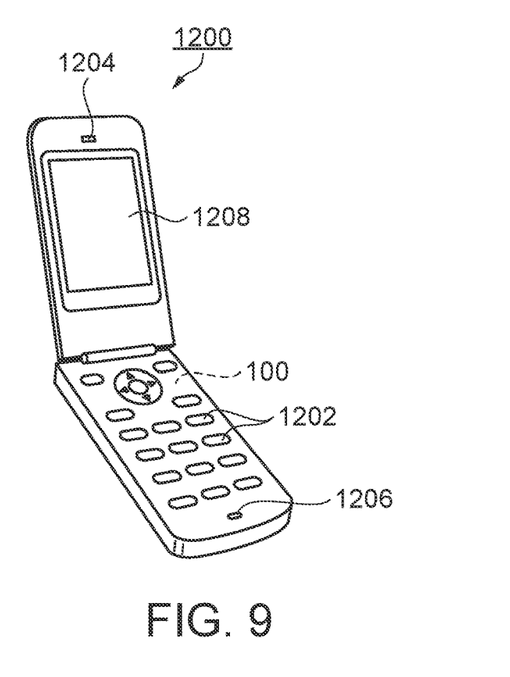
FIG. 9 is a perspective view schematically illustrating a configuration of a cellular phone (including PHS) as the electronic apparatus including the sensor device.

Next, a cellular phone (also including PHS) is illustrated as an example of the electronic apparatus according to the invention and will be described with reference to FIG. 9. FIG. 9 is a perspective view schematically illustrating the cellular phone (also including PHS) as an example of the electronic apparatus.

As illustrated in FIG. 9, a cellular phone 1200 is provided with a plurality of operating buttons 1202, an earpiece 1204, and a mouthpiece 1206, and a display portion 1208 is disposed between the operating buttons 1202 and the earpiece 1204. In such a cellular phone 1200, the acceleration sensor 100 is embedded.

Figure 10:
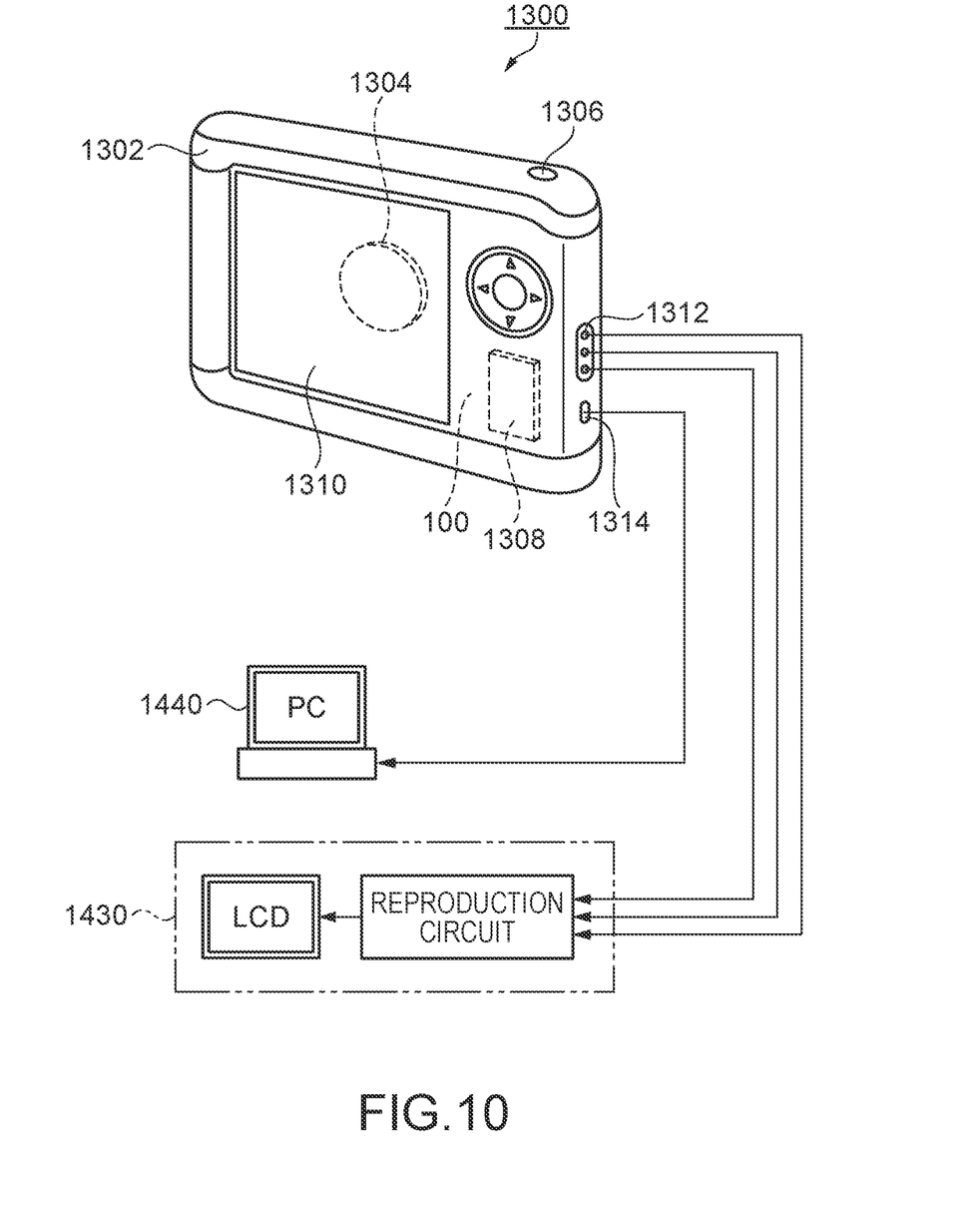
FIG. 10 is a perspective view schematically illustrating a configuration of a digital still camera as the electronic apparatus including the sensor device.

Next, a digital still camera is illustrated as an example of the electronic apparatus according to the invention and will be described with reference to FIG. 10. FIG. 10 is a perspective view schematically illustrating the digital still camera as an example of the electronic apparatus. Also, FIG. 10 simply illustrates connection of an external device.

Here, a camera in the related art, an optical image of a subject is exposed to a silver salt photographic film, but a digital still camera 1300 photoelectrically converts the optical image of the subject by an image capturing element such as a charge coupled device (CCD) and generates an image capturing signal (image signal).

A display portion 1310 is provided on a rear surface of a case (body) 1302 in the digital still camera 1300, is configured to display based on an image capturing signal by the CCD, and the display portion 1310 functions as a finder displaying a subject as an electronic image.

In addition, a light receiving unit 1304 including an optical lens (imaging optical system), the CCD, and the like is provided on a front surface side (rear surface side in drawing) of the case 1302.

When a photographer checks an image of the subject displayed on the display portion 1310 and presses a shutter button 1306, the image capturing signal of the CCD is transferred to and stored in a memory 1308 at this time.

In addition, a video signal output terminal 1312 and an input and output terminal 1314 for data communication are provided on a side surface of the case 1302 in the digital still camera 1300. Also, a television monitor 1430 is connected to the video signal output terminal 1312 as needed, and a personal computer 1440 is connected to the input and output terminal 1314 for data communication as needed. Further, the image capturing signal stored in the memory 1308 is output to the television monitor 1430 or the personal computer 1440 by predetermined operation. In such a digital still camera 1300, the acceleration sensor 100 is embedded.

The electronic apparatus exemplified as described above includes the acceleration sensor 100 which is capable of preventing the movable body 20 from being stuck to the substrate 10, and thus it is possible to have high reliability.

Also, in addition to a personal computer (mobile type personal computer) illustrated in FIG. 8, a cellular phone illustrated in FIG. 9, and a digital still camera illustrated in FIG. 10, the electronic apparatus including the acceleration sensor 100 can be applied to, for example, an ink jet type discharging apparatus (for example, ink jet printer), a laptop type personal computer, a television, a video camera, a video tape recorder, various navigation apparatuses, a pager, an electronic notebook (including communication function), an electronic dictionary, a calculator, an electronic game equipment, a head mounted display, a word processor, a workstation, a video phone, a television monitor for security, an electronic binocular, a POS terminal, a medical equipment (for example, electronic thermometer, blood pressure monitor, blood glucose meter, electrocardiogram measuring instrument, ultrasonic diagnostic equipment, and electronic endoscope), a fish finder, various measuring equipment, instrument (for example, instrument for vehicle, aircraft, rocket, and ship), posture control of a robot or a human, and a flight simulator.

Vehicle

Next, a vehicle according to the invention will be described with reference to drawings. The vehicle according to the invention includes the acceleration sensor 100 as the sensor device described above. Hereinafter, an automobile as an example of the vehicle using the acceleration sensor 100 as the sensor device according to the invention will be exemplified and described.

Figure 11:
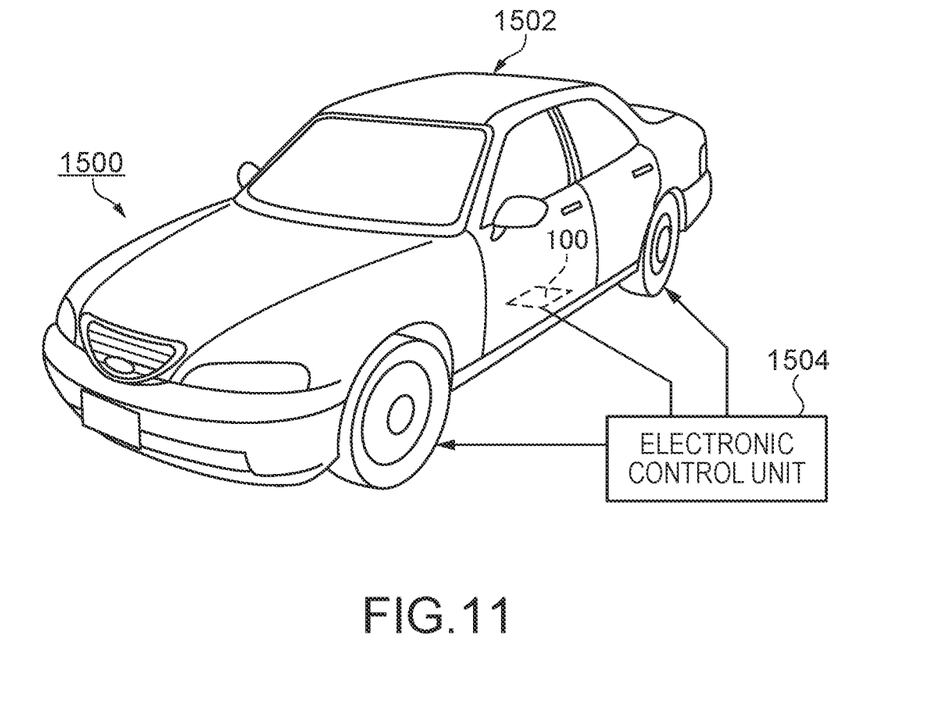
FIG. 11 is a perspective view schematically illustrating an automobile as an example of a vehicle including the sensor device.

First, an automobile is illustrated as an example of the vehicle according to the invention and will be described with reference to FIG. 11. FIG. 11 is a perspective view schematically illustrating an automobile 1500 which is exemplified as an example of the vehicle.

In the automobile 1500, the acceleration sensor 100 is embedded. Specifically, as illustrated in FIG. 11, an electronic control unit (ECU) 1504 which embeds the acceleration sensor 100 measuring an acceleration rate of the automobile 1500 and controls engine output is mounted in a vehicle body 1502 of the automobile 1500. In addition, the acceleration sensor 100 can be widely applied to a vehicle body posture control unit, an anti-lock braking system (ABS), an air bag, and a tire pressure monitoring system (TPMS).

The automobile 1500 includes the acceleration sensor 100 capable of preventing the movable body 20 from being stuck to the substrate 10, and thus it is possible to include high reliability.

The embodiments and the modification example described above are an example, and the invention is not limited thereto. For example, each embodiment and each modification example can be appropriately combined.

The invention includes the substantially same configurations (for example, configurations including the same function, method, and result, or configurations including the same object and effect) as the configurations described in the embodiments. In addition, the invention includes a configuration in which an unessential part of the configuration described in the embodiment is replaced. In addition, the invention includes configurations that obtain the same effects as the configurations described in the embodiments or a configuration capable of achieving the same object. In addition, the invention includes configurations in which known techniques are added to the configurations described in the embodiments.

The invention claimed is:

1. A sensor device comprising:
   a substrate that includes a first surface;
   a recess that is provided in the first surface, the recess extending along a first direction;
   a fixed electrode that is provided on the first surface;
   a dummy electrode that is provided on the first surface, the dummy electrode being adjacent to the fixed electrode, the fixed electrode and the dummy electrode being arranged along a second direction perpendicular to the first direction;
   an insulating portion that is provided on the first surface between the fixed electrode and the dummy electrode; and
   a movable body that is spaced apart from the substrate and faces the first surface of the substrate, the movable body being configured with:
      a support fixing the movable body to the substrate, the movable body being movable with respect to the substrate with the support as a fulcrum;
      a first region facing the fixed electrode;
      a second region partially facing the dummy electrode; and
      a connector connecting between the first region and the second region,
   wherein the fixed electrode is provided with an extension electrode, and the extension electrode extends from only an edge of the fixed electrode toward the dummy electrode along the second direction,
   an end of the extension electrode and an end of the dummy electrode are spaced apart from each other via the insulating portion in a plan view,
   the extension electrode partially faces the connector in the plan view, and the insulating portion that is located between the extension electrode and the dummy electrode faces the connector in the recess in the plan view, and
   a center portion of the end of the dummy electrode along the first direction extends toward the edge of the fixed electrode and overlaps with the recess in the plan view.

2. The sensor device according to claim 1,
   wherein a width in the first direction of the connector is narrower than widths in the first direction of the first region and the second region.

3. The sensor device according to claim 2,
   wherein a plurality of the connectors are provided.

4. The sensor device according to claim 3,
   wherein the connectors are respectively provided in both ends of the movable body in the first direction.

5. The sensor device according to claim 1,
   wherein the movable body further has a groove,
   the groove is provided at a position that is surrounded by edges of the first region, the second region, and the connector, and
   wherein the groove overlaps with the insulating portion in the plan view.

6. The sensor device according to claim 5,
   wherein the groove is by configured by one of a through hole penetrating from one surface to the other surface of the movable body or a bottomed groove in which an opening of the bottomed groove faces the first surface of the substrate.

7. An electronic apparatus comprising:
   a display displaying an image;
   a sensor device configured to detect a value corresponding to an external force applied to the electronic apparatus, the sensor device including:
      a substrate that includes a first surface
      a recess that is provided in the first surface, the recess extending along a first direction;
      a fixed electrode that is provided on the first surface,
      a dummy electrode that is provided on the first surface, the dummy electrode being adjacent to the fixed electrode, the fixed electrode and the dummy electrode being arranged along a second direction perpendicular to the first direction;
      an insulating portion that is provided on the first surface between the fixed electrode and the dummy electrode; and
      a movable body that is spaced apart from the substrate and faces the first surface of the substrate, the movable body being configured with:
         a support fixing the movable body to the substrate, the movable body being movable with respect to the substrate with the support as a fulcrum:
         a first region facing the fixed electrode:
         a second region partially facing the dummy electrode; and
         a connector connecting between the first region and the second region; and
   a housing that houses the display and the sensor device,
   wherein the fixed electrode is provided with an extension electrode, and the extension electrode extends from only an edge of the fixed electrode toward the dummy electrode along the second direction,
   an end of the extension electrode and an end of the dummy electrode are spaced apart from each other via the insulating portion in a plan view,
   the extension electrode partially faces the connector in the plan view, and the insulating portion that is located between the extension electrode and the dummy electrode faces the connector in the recess in the plan view, and
   a center portion of the end of the dummy electrode along the first direction extends toward the edge of the fixed electrode and overlaps with the recess in the plan view.

8. A vehicle comprising:
   a body;
   an electronic control unit housed in the body; and
   a sensor device disposed in the electronic control unit, the sensor device including:
      a substrate that includes a first surface
      a recess that is provided in the first surface, the recess extending along a first direction;
      a fixed electrode that is provided on the first surface;
      a dummy electrode that is provided on the first surface, the dummy electrode being adjacent to the fixed electrode, the fixed electrode and the dummy electrode being arranged along a second direction perpendicular to the first direction,
      an insulating portion that is provided on the first surface between the fixed electrode and the dummy electrode; and a movable body that is spaced apart from the substrate and faces the first surface of the substrate, the movable body being configured with:
  a support fixing the movable body to the substrate, the movable body being movable with respect to the substrate with the support as a fulcrum:
  a first region facing the fixed electrode;
  a second region partially facing the dummy electrode; and
  a connector connecting between the first region and the second region,
wherein the fixed electrode is provided with an extension electrode, and the extension electrode extends from only an edge of the fixed electrode toward the dummy electrode along the second direction,
an end of the extension electrode and an end of the dummy electrode are spaced apart from each other via the insulating portion in a plan view,
the extension electrode partially faces the connector in the plan view, and the insulating portion that is located between the extension electrode and the dummy electrode faces the connector in the recess in the plan view, and
a center portion of the end of the dummy electrode along the first direction extends toward the edge of the fixed electrode and overlaps with the recess in the plan view.

* * * * *